United States Patent
Rubshtein et al.

(10) Patent No.: US 9,113,025 B2
(45) Date of Patent: Aug. 18, 2015

(54) IMAGE SIGNAL PROCESSOR CIRCUITS AND METHODS FOR CORRECTING CROSSTALK ARTIFACTS

(71) Applicant: Samsung Electronics Co., Ltd., Gyeonggi-do (KR)

(72) Inventors: Andrey Rubshtein, Beer-Sheva (IL); Eugene Fainstain, Netanya (IL)

(73) Assignee: Samsung Electronics Co., Ltd. (KR)

( * ) Notice: Subject to any disclaimer, the term of this patent is extended or adjusted under 35 U.S.C. 154(b) by 201 days.

(21) Appl. No.: 13/833,851

(22) Filed: Mar. 15, 2013

(65) Prior Publication Data
US 2014/0267838 A1    Sep. 18, 2014

(51) Int. Cl.
| | |
|---|---|
| H04N 9/04 | (2006.01) |
| G06T 5/00 | (2006.01) |
| H04N 9/67 | (2006.01) |
| G06T 5/20 | (2006.01) |
| H04N 5/217 | (2011.01) |

(52) U.S. Cl.
CPC .............. H04N 9/045 (2013.01); G06T 5/002 (2013.01); G06T 5/20 (2013.01); H04N 9/67 (2013.01); *G06T 2207/10024* (2013.01); *H04N 5/217* (2013.01)

(58) Field of Classification Search
CPC ......... H04N 5/21; H04N 5/217; H04N 17/00; H04N 7/144; H04N 7/15; H04N 7/147; H04N 9/646; H04N 9/045; G06T 5/002
USPC ......... 348/241, 242, 253, 256, 744, 745, 609, 348/627; 382/167, 162
See application file for complete search history.

(56) References Cited

U.S. PATENT DOCUMENTS

| | | | |
|---|---|---|---|
| 7,502,505 B2 | 3/2009 | Malvar et al. | |
| 7,561,194 B1* | 7/2009 | Luo | 348/241 |
| 8,767,100 B2* | 7/2014 | Chen et al. | 348/242 |
| 2006/0098868 A1* | 5/2006 | Fainstain et al. | 382/167 |
| 2007/0139740 A1 | 6/2007 | Igura et al. | |
| 2009/0052775 A1 | 2/2009 | Moon et al. | |
| 2009/0073319 A1 | 3/2009 | Neuman et al. | |
| 2009/0091647 A1* | 4/2009 | Hiromichi et al. | 348/294 |
| 2009/0141977 A1 | 6/2009 | Hong et al. | |
| 2012/0206635 A1* | 8/2012 | Kikuchi et al. | 348/308 |
| 2013/0100311 A1* | 4/2013 | Ogasahara | 348/223.1 |
| 2013/0135500 A1* | 5/2013 | Theuwissen | 348/242 |

FOREIGN PATENT DOCUMENTS

| | | |
|---|---|---|
| JP | 2002152768 A | 5/2002 |
| JP | 2006202091 A | 8/2006 |
| JP | 2009100150 A | 5/2009 |
| KR | 1020050051437 | 6/2005 |
| KR | 1020070046010 | 5/2007 |

* cited by examiner

*Primary Examiner* — Aung S Moe
(74) *Attorney, Agent, or Firm* — Myers Bigel Sibley & Sajovec, P.A.

(57) ABSTRACT

Methods and circuits can be provided to correct crosstalk artifacts by generating image data correction matrices for respective pixel locations in an image sensor, based on pre-calibration matrices associated with the respective pixel locations. The image data correction matrices can be applied to the respective pixel locations to reduce imaging crosstalk artifacts associated with at least one of disparity, luminance, and chrominance.

16 Claims, 11 Drawing Sheets

| GB₁₁ 402 | B₁₂ 403 | GB₁₃ 404 |
|---|---|---|
| R₂₁ 405 | GR₂₂ 401 | R₂₃ 406 |
| GB₃₁ 407 | B₃₂ 408 | GB₃₃ 409 |

FIG. 4B

| $GR_{11}$ 412 | $R_{12}$ 413 | $GR_{13}$ 414 |
|---|---|---|
| $B_{21}$ 415 | $GB_{22}$ 411 | $B_{23}$ 416 |
| $GR_{31}$ 417 | $R_{32}$ 418 | $GR_{33}$ 419 |

FIG. 5A

| | | |
|---|---|---|
| $B_{11}$ 502 | $GB_{12}$ 503 | $B_{13}$ 504 |
| $GR_{21}$ 505 | $R_{22}$ 501 | $GR_{23}$ 506 |
| $B_{31}$ 507 | $GB_{32}$ 508 | $B_{33}$ 509 |

FIG. 5B

|  | $B_{12}$ |  |
|---|---|---|
| $R_{21}$ | $GR_{22}$ <br> 511 | $R_{23}$ |
|  | $B_{32}$ |  |

FIG. 5C

|  | $R_{12}$ |  |
|---|---|---|
| $B_{21}$ | $GB_{22}$ <br> 521 | $B_{23}$ |
|  | $R_{32}$ |  |

FIG. 5D

| $R_{11}$ | $GR_{12}$ | $R_{13}$ |
|---|---|---|
| $GB_{21}$ | $B_{22}$ 531 | $GB_{23}$ |
| $R_{31}$ | $GR_{32}$ | $R_{33}$ |

IMAGE SIGNAL PROCESSOR CIRCUITS AND METHODS FOR CORRECTING CROSSTALK ARTIFACTS

FIELD OF THE INVENTION

The inventive concept relates to digital image signal processing in general, and more particularly to devices and methods for correcting crosstalk artifacts.

BACKGROUND

An image sensor is a device that converts an optical signal into an electrical signal. As the size of each pixel in the image sensor decreases, an undesired effect can be created, which is referred to as crosstalk. Crosstalk can be a major cause of artifacts in images taken by the image sensor.

SUMMARY

Embodiments can provide methods for correcting crosstalk artifacts in an image signal processor circuit. In some embodiments according to the inventive concept, methods and circuits can be provided to correct crosstalk artifacts by generating image data correction matrices for respective pixel locations in an image sensor, based on pre-calibration matrices associated with the respective pixel locations. The image data correction matrices can be applied to the respective pixel locations to reduce imaging crosstalk artifacts associated with at least one of disparity, luminance, and chrominance.

In some embodiments the method includes: performing an interpolation operation using color values of neighbor pixels to obtain interpolated color values at a current pixel; determining first matrix coefficients; and performing a first multiplication operation between the interpolated color values and the first matrix to correct disparity between the current pixel and the neighbor pixels.

According to at least some example embodiments, the first matrix is expressed as follows:

$$\begin{pmatrix} 1 & 0 & 0 & 0 \\ \frac{d_1}{2} & 1+\frac{d_2}{2} & \frac{d_2}{2} & \frac{d_3}{2} \\ -\frac{d_1}{2} & -\frac{d_2}{2} & 1-\frac{d_2}{2} & -\frac{d_3}{2} \\ 0 & 0 & 0 & 1 \end{pmatrix}$$

wherein d1, d2, and d3 are the first matrix coefficients.

According to at least some example embodiments, the method for correcting crosstalk artifacts in an image signal processor may further include determining second matrix coefficients; and performing a second multiplication operation between the interpolated color values and the second matrix to correct chromaticity.

According to at least some example embodiments, the second matrix is expressed as follows:

$$\begin{pmatrix} a_{11} & a_{12} & a_{13} \\ a_{21} & a_{22} & a_{23} \\ a_{31} & a_{32} & a_{33} \end{pmatrix}$$

wherein $a_{11}$, $a_{12}$, $a_{13}$, $a_{31}$, $a_{32}$, and $a_{33}$ are coefficients.

According to at least some example embodiments, the method for correcting crosstalk artifacts in an image signal processor may further include determining a third matrix coefficient; and performing a third multiplication operation between the interpolated color values and the third matrix to correct Luma.

According to at least some example embodiments, the third matrix is expressed as follows:

$$\begin{pmatrix} C & 0 & 0 & 0 \\ 0 & C & 0 & 0 \\ 0 & 0 & C & 0 \\ 0 & 0 & 0 & C \end{pmatrix}$$

wherein C is a coefficient.

According to at least some example embodiments, the first, second, and third multiplication operations are performed sequentially.

According to at least some example embodiments, the first, second, and third multiplication operations are performed simultaneously.

According to at least some example embodiments, the first, second, and third multiplication operations do not affect each other.

At least one other example embodiment provides an image signal processor.

According to at least some example embodiments, the image signal processor includes: a current pixel selector configured to select a current pixel in an image data output from an image sensor; an interpolator configured to obtain interpolated color values at the current pixel; and a disparity filter configured to perform a first multiplication operation between the interpolated color values and a first matrix for correcting disparity between the current pixel and neighbor pixels.

According to at least some example embodiments, the image signal processor may further include a Chroma filter configured to perform a second multiplication operation between the interpolated color values and a second matrix for correcting chromaticity.

According to at least some example embodiments, the image signal processor may further include a Luma filter configured to perform a third multiplication operation between the interpolated color values and a third matrix for correcting Luma.

According to at least some example embodiments, the first, second, and third multiplication operations are performed sequentially.

According to at least some example embodiments, the first, second, and third multiplication operations are performed simultaneously.

According to at least some example embodiments, the first, second, and third multiplication operations do not affect each other.

DETAILED DESCRIPTION

The invention now will be described more fully hereinafter with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be appreciated by one skilled in the art, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

As described herein, in some embodiments according to the inventive concept, an artificial grid construct can be arranged to overlie some physical pixel locations included in an image sensor. In some embodiments, each of the locations in the grid can correspond to a subset of the physical pixels in the sensor, in other embodiments, however, the locations in the grid can be in a one-to-one correspondence with the physical pixels in the sensor.

A calibration process can be employed to determine correction matrices for pixels that are associated with locations in the grid. For example, during calibration, a known target can be sampled using the image sensor. The values for the physical pixels that correspond to the grid locations can be analyzed to determine how the sample values should be corrected to more closely correspond to the known values of the target.

Correction matrices for the remaining physical pixels (that do not correspond to the grid locations) can be determined based on correction matrices determined during calibration by, for example, interpolation. Accordingly, if an physical pixel is located between four adjacent grid locations, a correction matrix for the actual pixel can be determined by interpolating from the correction matrices associated with each of the adjacent grid locations. It will be understood, however, that in embodiments where each of the physical pixels in the image sensor corresponds to a grid location, no interpolation may be necessary to determine the correction matrices for the physical pixels. Rather, the correction matrices for each of the physical pixels could be determined during calibration.

In some embodiments, the interpolated correction matrices can be used to correct disparity, Luma, and Chroma between physical pixels. Furthermore, each of these corrections can be separable from one another such that any of the corrections can be performed without affecting the remaining corrections. Furthermore, the corrections may be carried out in any order without any impact on the outcome of each of the corrections.

Figure 1:
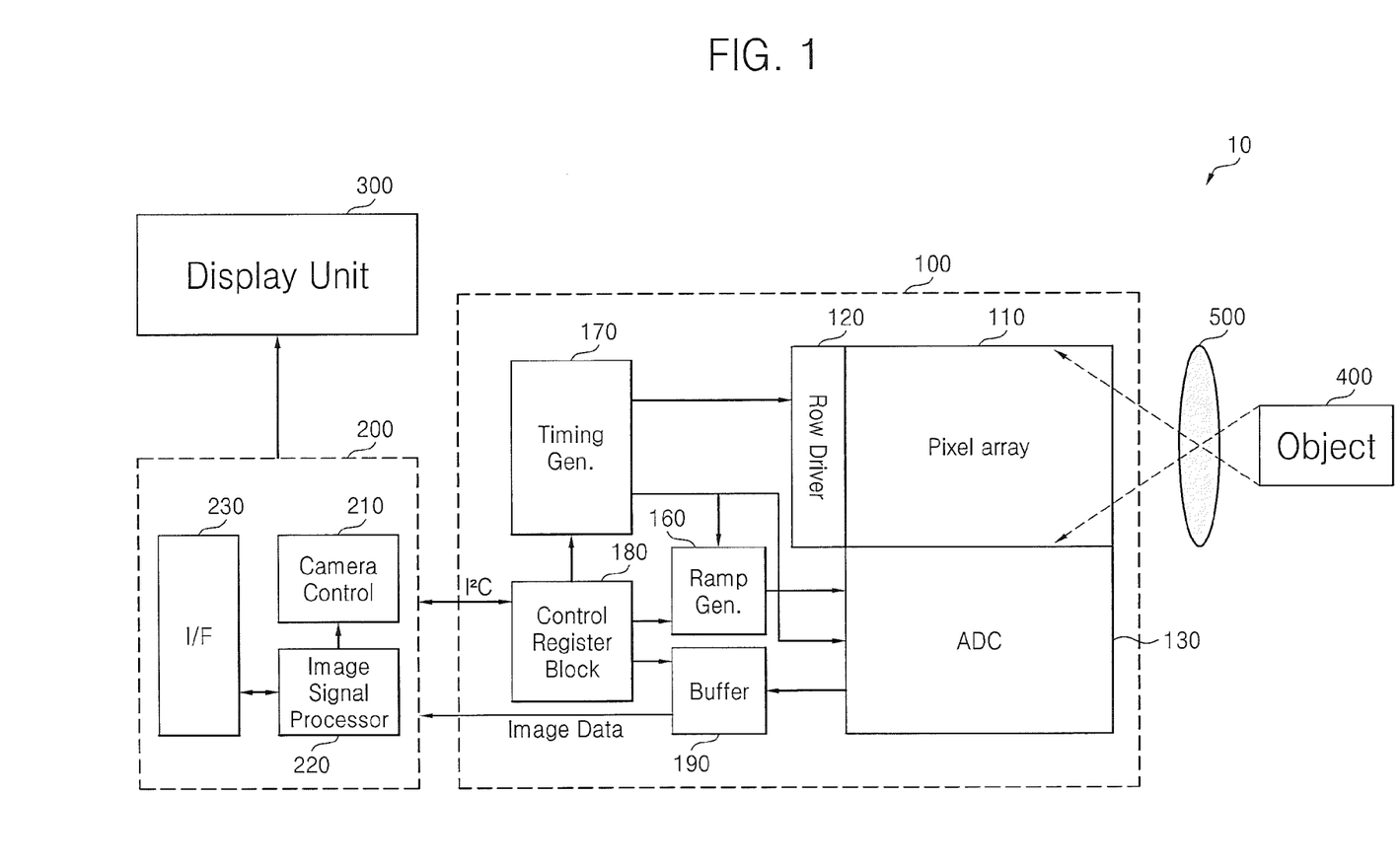
FIG. 1 is a schematic block diagram of an image processing system in some embodiments of the inventive concept.

FIG. 1 is a schematic block diagram of an image processing system 10 according to embodiments of the inventive concept. Referring to FIG. 1, the image sensing system 10 includes an image sensor 100, a digital signal processor (DSP) 200, and a display unit 300.

The image sensor 100 includes a pixel array or an active pixel sensor (APS) array 110, a row driver 120, an analog-to-digital converter (ADC) 130, a ramp generator 160, a timing generator 170, a control register block 180, and a buffer 190.

The image sensor 100 is controlled by the DSP 200 to sense an object 400 photographed through a lens 500 and output electrical image data. In other words, the image sensor 100 converts a sensed optical image into image data and outputs the image data.

The pixel array 110 includes a plurality of photo sensitive devices such as photo diodes or pinned photo diodes. The pixel array 110 senses light using the photo sensitive devices and converts the light into an electrical signal to generate an image signal.

The timing generator 170 may output a control signal to the row driver 120, the ADC 143, and the ramp generator 160 to control the operations of the row driver 120, the ADC 130, and the ramp generator 160. The control register block 180 may output respect control signals to the ramp generator 160, the timing generator 170, and the buffer 190 to control the operations thereof. The control register block 180 is controlled by a camera control 210.

The row driver 120 drives the pixel array 110 in units of rows. For instance, the row driver 120 may generate a row selection signal. That is, the row driver 120 decodes a row control signal (e.g. an address signal) generated by the timing generator 170, and selects at least one of rows in the pixel array 110 in response to the decoded row control signal. The pixel array 110 outputs to the ADC 130 pixel signals from the row selected by the row selection signal provided from the row driver 120.

The ADC 130 converts the pixel signals from the pixel array 110 to digital pixel signals and outputs the digital pixel signals to the buffer 190. The buffer 190 temporarily stores the digital pixel signals output from the ADC 130 and outputs the buffered digital pixel signals to the DSP 200.

The DSP 200 may output image data, which has been sensed and output by the image sensor 100, to the display unit 300. At this time, the display unit 300 may be any device that can display an image for viewing. For instance, the display unit 300 may be a computer, a mobile phone, or any type of image display terminal. The DSP 200 includes the camera control 210, an image signal processor circuit 220, and a personal computer (PC) interface (I/F) 230. The camera control 210 controls the control register block 180. The camera control 210 may control the image sensor 100 according to the I$^2$C protocol. Other protocols can be used.

The image signal processor circuit 220 receives image data, i.e., the buffered digital pixel signals from the buffer 190, performs a processing operation on an image corresponding to the image data, and outputs the image to the display unit 300 through PC I/F 230. The image data may be called an "image".

Figure 2:
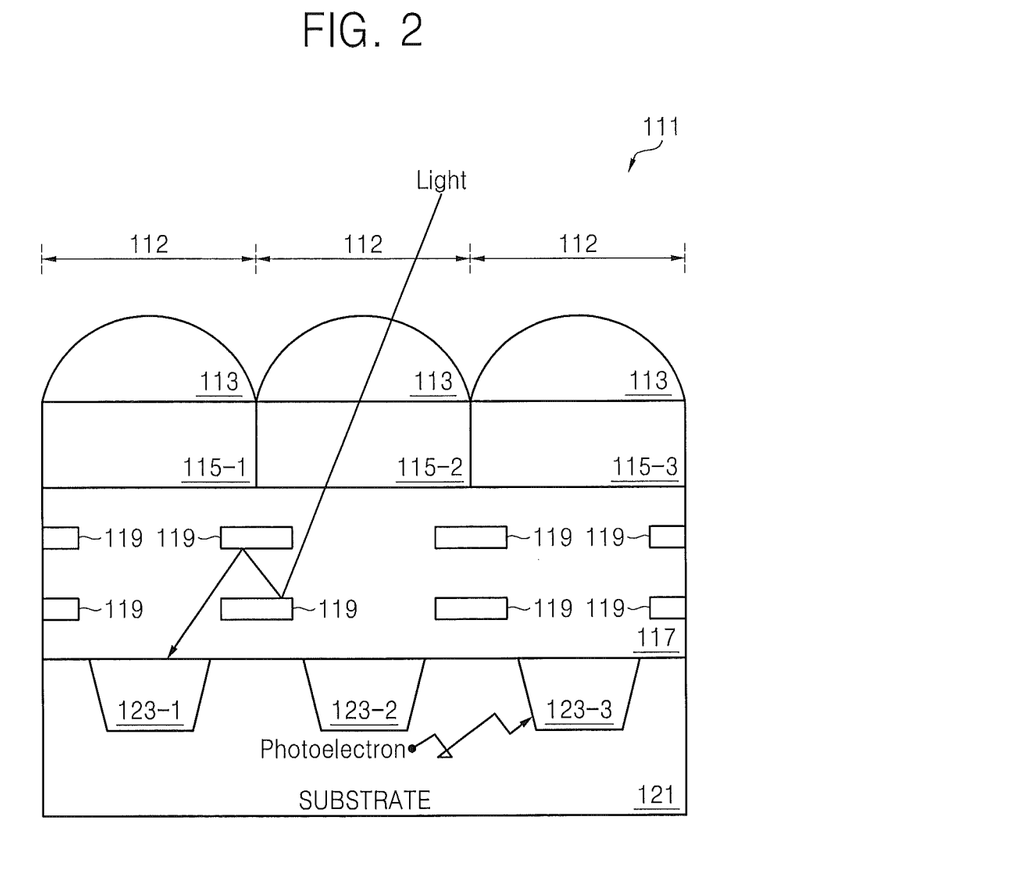
FIG. 2 is a cross-sectional view of a pixel region included in the pixel array of an image sensor illustrated in FIG. 1, according to some embodiments of the inventive concept.

FIG. 2 is a cross-sectional view of a pixel region included in the pixel array of an image sensor illustrated in FIG. 1, according to embodiments of the inventive concept. Referring to FIGS. 1 and 2, the pixel region 111 includes microlenses 113, a color filter 115-1, 115-2 or 115-3, an inter-metal dielectric layer 117 and a carrier substrate 121.

Each of the microlenses 113 focuses light incident from an external source. In some embodiments, the pixel region 111 may be implemented without including the microlenses 113.

The color filter 115-1, 115-2 or 115-3 transmits wavelengths in a visible region. For example, the color filter 115-1, 115-2 or 115-3 may be a red filter, a green filter, or a blue filter respectively. The red filter transmits light having wavelengths in a red region from among the wavelengths in the visible region. The green filter transmits light having wavelengths in a green region from among the wavelengths in the visible region. The blue filter transmits light having wavelengths in a blue region from among the wavelengths in visible region. In some embodiments, the color filter 115-1, 115-2, or 115-3 may be a cyan filer, a magenta filter, or a yellow filter, respectively. The cyan filter transmits light having wavelengths in a 450-550 nm region from among the wavelengths in the visible region. The magenta filter transmits light having wavelengths in a 400-480 nm region from among the wavelengths in the visible region. The yellow filter transmits light having wavelengths in a 500-600 nm region from among the wavelengths in the visible region. Other filters can be used.

The inter-metal dielectric layer 117 may be formed of an oxide layer, or a composite layer of an oxide layer and a nitride layer. The oxide layer may be a silicon oxide layer. The inter-metal dielectric layer 117 may include metals 119. Electrical wiring for sensing operations of the pixel region 111 may be provided by the metals 119. The metals 119 may include copper, titanium, or titanium nitride. Other metals can be used. The carrier substrate 121 may be a silicon substrate. Other substrates can be used. The photodetectors 123-1, 123-2, and 123-3 are in the carrier substrate 121. Each of the photodetectors 123-1, 123-2, and 123-3 may generate photoelectrons in response to light incident from an external source. Each of the photodetectors 123-1, 123-2, and 123-3 is a photosensitive element and may be implemented by using a photodiode, a phototransistor, a photogate, or a pinned photodiode (PPD).

As appreciated by the present inventors, as the pixel size 112 decreases, the light passed through the filter 115-2, for example, can be transmitted to the photodetector 123-1 rather than the photodetector 123-2. This phenomenon is called the optical crosstalk. In addition, part of the photoelectrons generated by the photodetector 123-2 can flow to the photodetector 123-3. This phenomenon is called electrical crosstalk. The optical or electrical crosstalk can cause artifacts in images taken by the image sensor 100. The artifacts are related to Luma, Chroma, and disparity.

Luma represents the brightness in an image. Luma may be called luminance. Luma can be expressed as shown below in Equation 1.

$$Y = R + G + B \quad \text{[Equation 1]}$$

In Equation 1, Y is Luma, R is a red pixel signal having the red value, G is a green pixel signal having the green value, and B is a blue pixel signal having the blue value.

Chroma represents the color information in an image. Chroma may be called chromaticity. Chroma can be expressed as shown below in Equation 2.

$$Rn = R/(R+G+B), Bn = B/(R+G+B) \quad \text{[Equation 2]}$$

In Equation 2, Rn is a first component, Bn is a second component, R is a red pixel signal having the red value, G is a green pixel signal having the green value, and B is a blue pixel signal having the blue value. That is the Chroma is represented as the first and second components.

Figure 3:
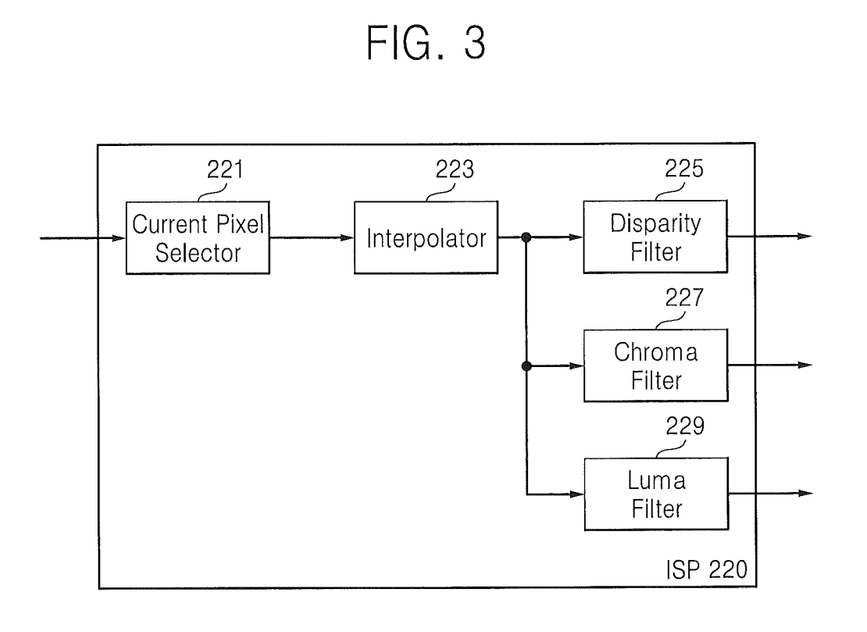
FIG. 3 is a schematic block diagram of an image signal processor circuit illustrated in FIG. 1, according to embodiments of the inventive concept.

FIG. 3 is a schematic block diagram of an image signal processor circuit 220 illustrated in FIG. 1, in some embodiments of the inventive concept. Referring to FIGS. 1 and 3, the image signal processor circuit 220 includes a current pixel selector 221, an interpolator 223, a disparity filter 225, a Chroma filter 227, and a Luma filter 229. Each component 221, 223, 225, 227 and 229 can be configured as software or hardware or a combination thereof.

The current pixel selector 221 selects the current pixel in the image data output from the image sensor 100. Hereafter the pixel indicates a sample of the image data. The interpolator 223 is used to obtain the interpolated color values at the current pixel selected by the current pixel selector 221, as illustrated, for example, in FIG. 4A. The disparity filter 225 is used to improve color disparity between the current pixel and the neighboring pixels, as illustrated, for example, in FIGS. 4A and 4B. The Chroma filter 227 is used to correct chromaticity, as illustrated, for example, in FIGS. 5A to 5D. The Luma filter 229 is used to correct Luma, as illustrated, for example, in FIG. 6.

In some embodiments, operations of the disparity filter 225, the Chroma filter 227, and the Luma filter 229 may be performed sequentially. In some embodiments, the operations of the disparity filter 225, the Chroma filter 227, and the Luma filter 229 may be performed simultaneously, as the disparity filter 225, the Chroma filter 227, and the Luma filter 229 are orthogonal to each other.

Figure 4A:
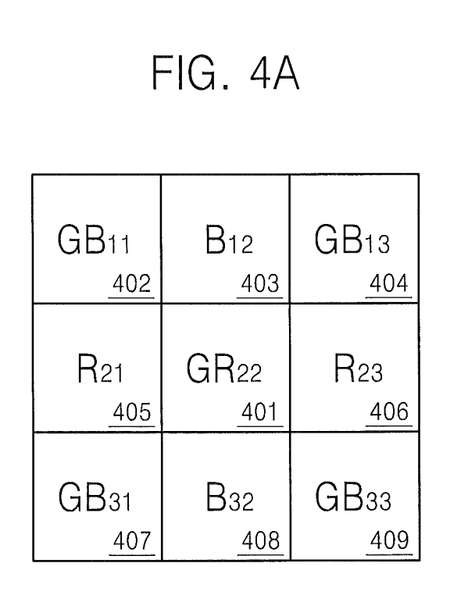
FIG. 4A is a diagram illustrating disparity correcting operations according to embodiments of the inventive concept.

FIG. 4A is a diagram illustrating disparity correcting operations in some embodiments of the inventive concept. Referring to FIGS. 1 to 3, and 4A, the current pixel 401 has the color value (e.g. the green value $GR_{22}$). The color value $GR_{22}$ is different from the color values (e.g. $GB_{11}$, $GB_{13}$, $GB_{31}$, and $GB_{33}$) of the neighbor pixels (402, 404, 407 and 409). The color value $GR_{22}$ is the green value close to red, and each of the color values $GB_{11}$, $GB_{13}$, $GB_{31}$, and $GB_{33}$ is the green value close to blue.

The difference between the color value $GR_{22}$ at current pixel 401 and the color value $GB_{11}$, $GB_{13}$, $GB_{31}$, or $GB_{33}$ at neighbor pixel 402, 404, 407, or 409 is defined as disparity. The disparity is expressed as shown below in Equation 3.

$$D = (GR - GB)/(GR + GB) \quad \text{[Equation 3]}$$

In Equation 3, D is disparity, GR is the color value at the current pixel 401, and GB is the color value at the neighbor pixel 402, 404, 407, or 409. In some embodiments, GB may be the color value at the current pixel 401, and GR may be color value at the neighbor pixel 402, 404, 407, or 409. Therefore the disparity should be corrected.

The interpolator 223 performs an interpolation operation by using the color values of neighbor pixels 402, 404, 407, and 409 to obtain the interpolated color values. For example, the red value $R_{22}$ at the current pixel 401 can be interpolated as shown below in Equation 4.

$$R_{22} = (R_{21} + R_{23})/2 \quad \text{[Equation 4]}$$

In Equation 4, $R_{21}$ and $R_{23}$ are the red value at pixels 405 and 406, respectively. $R_{22}$ is the interpolated red value at the current pixel 401.

The blue value $B_{22}$ at the current pixel 401 can be interpolated as shown below in Equation 5.

$$B_{22} = (B_{12} + B_{32})/2 \quad \text{[Equation 5]}$$

In Equation 5, $B_{12}$ and $B_{32}$ are the blue value at pixels 403 and 408. $B_{22}$ is the interpolated blue value at the current pixel 401.

The green value $GB_{22}$ close to blue at the current pixel 401 can be interpolated as shown below in Equation 6.

$$GB_{22} = (GB_{11} + GB_{13} + GB_{31} + GB_{33})/4 \quad \text{[Equation 6]}$$

In Equation 6, $GB_{11}$, $GB_{13}$, $GB_{31}$ and $GB_{33}$ are the respective green values GB at the pixels 402, 404, 407 and 409. $GB_{22}$ is the interpolated green value at the current pixel 401.

The disparity filter 225 determines the first matrix coefficients. The first matrix is expressed as follows:

$$\begin{pmatrix} 1 & 0 & 0 & 0 \\ \frac{d_1}{2} & 1 + \frac{d_2}{2} & \frac{d_2}{2} & \frac{d_3}{2} \\ -\frac{d_1}{2} & -\frac{d_2}{2} & 1 - \frac{d_2}{2} & -\frac{d_3}{2} \\ 0 & 0 & 0 & 1 \end{pmatrix}$$

where, $d_1$, $d_2$, and $d_3$ are coefficients.

The disparity filter 225 performs the first multiplication operation between the interpolated color value and the first matrix to correct disparity between the color value $GR_{22}$ at the current pixel 401 and the color value $GB_{11}$, $GB_{13}$, $GB_{31}$, or $GB_{33}$ at the neighbor pixel 402, 404, 407, or 409. The first multiplication operation is expressed as shown below in Equation 7.

$$\begin{pmatrix} R'_{xy} \\ GR'_{xy} \\ GB'_{xy} \\ B'_{xy} \end{pmatrix} = \begin{pmatrix} 1 & 0 & 0 & 0 \\ \frac{d_1}{2} & 1+\frac{d_2}{2} & \frac{d_2}{2} & \frac{d_3}{2} \\ -\frac{d_1}{2} & -\frac{d_2}{2} & 1-\frac{d_2}{2} & -\frac{d_3}{2} \\ 0 & 0 & 0 & 1 \end{pmatrix} \begin{pmatrix} R_{xy} \\ GR_{xy} \\ GB_{xy} \\ B_{xy} \end{pmatrix} \quad [\text{Equation 7}]$$

In Equation 7, $R'_{xy}$, $GR'_{xy}$, $GB'_{xy}$, and $B'_{xy}$ are the color values after the first multiplication operation, and $R_{xy}$, $GR_{xy}$, $GB_{xy}$, and $B_{xy}$ are the color values before the first multiplication operation. xy are the pixel location. For example, the color value $GR'_{22}$ at the current pixel 401 after the first multiplication operation is expressed as shown below in Equation 8.

$$GR'_{22} = \frac{d_1}{2}\frac{(R_{21}+R_{23})}{2} + \left(1+\frac{d_2}{2}\right)GR_{22} + \left(\frac{d_2}{2}\right)\frac{(GB_{11}+GB_{13}+GB_{31}+GB_{33})}{4} + \frac{d_3}{2}\frac{(B_{12}+B_{32})}{2} \quad [\text{Equation 8}]$$

By calculating the color value $GR'_{22}$ at the current value 401, the disparity filter 225 corrects disparity between the color value $GR_{22}$ at the current pixel 401 and the color value $GB_{11}$, $GB_{13}$, $GB_{31}$, or $GB_{33}$ at the neighbor pixel 402, 404, 407, or 409.

Figure 4B:
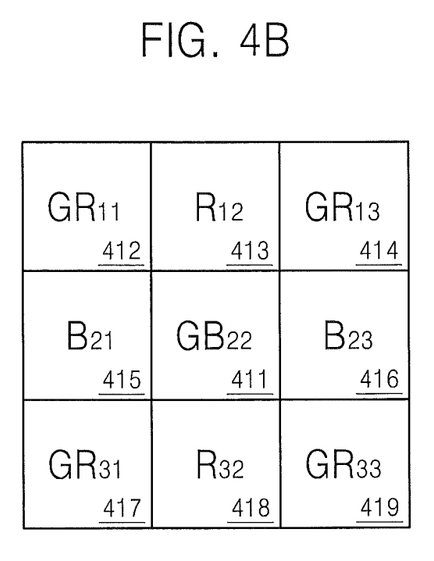
FIG. 4B is a diagram illustrating disparity correcting operations according to embodiments of the inventive concept.

FIG. 4B is a diagram for explaining disparity correcting operation according to some example embodiments of the inventive concept. Referring to FIGS. 1 to 3, 4A, and 4B, the interpolator 223 performs an interpolation operation by using the color values of neighbor pixels 402, 404, 407, and 409 to obtain the interpolated color values.

The color value $GB'_{22}$ at the current pixel 411 after the first multiplication operation is expressed as shown below in Equation 9.

$$GB'_{22} = -\frac{d_1}{2}\frac{(R_{12}+R_{32})}{2} - \frac{d_2}{2}\frac{(GR_{11}+GR_{13}+GR_{31}+GR_{33})}{4} + \left(1-\frac{d_2}{2}\right)GB_{22} - \frac{d_3}{2}\frac{(B_{21}+B_{23})}{2} \quad [\text{Equation 9}]$$

Figure 5A:
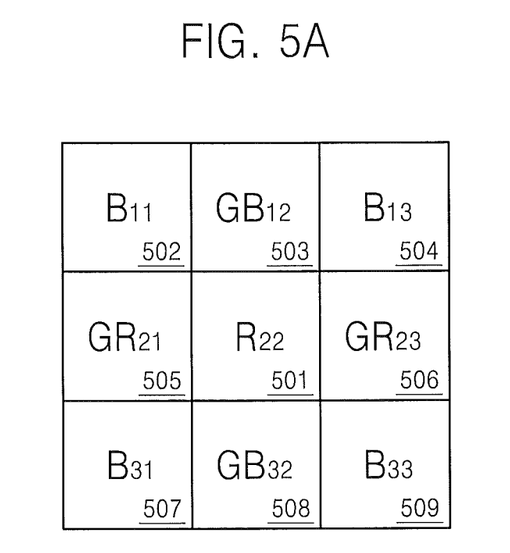
FIG. 5A is a diagram illustrating chromaticity correcting operations according to embodiments of the inventive concept.

FIG. 5A is a diagram illustrating chromaticity correcting operations in some embodiments of the inventive concept. Referring to FIGS. 1 to 3 and 5A, the Chroma filter 227 determines second matrix coefficients. The Chroma filter 227 performs a second multiplication operation between the interpolated color values and a second matrix for correcting chromaticity. The green value $G_{22}$ at the current pixel 501 can be interpolated as shown below in Equation 10.

$$G_{22}=(GB_{12}+GR_{21}+GR_{23}+GB_{32})/4 \quad [\text{Equation 10}]$$

$GB_{12}$, $GR_{21}$, $GR_{23}$ and $GB_{32}$ are the pixel values at the neighboring pixels 503, 505, 506, and 508.

The blue value $B_{22}$ at the current pixel 501 can be interpolated as shown below in Equation 11.

$$B_{22}=(B_{11}+B_{13}+B_{31}+B_{33})/4 \quad [\text{Equation 11}]$$

$B_{11}$, $B_{13}$, $B_{31}$ and $B_{33}$ are the pixel values at the neighboring pixels 502, 504, 507, and 509. The second matrix is expressed as follows:

$$\begin{pmatrix} a_{11} & a_{12} & a_{13} \\ a_{21} & a_{22} & a_{23} \\ a_{31} & a_{32} & a_{33} \end{pmatrix}$$

where, $a_{11}$, $a_{12}$, $a_{13}$, $a_{21}$, $a_{22}$, $a_{23}$, $a_{31}$, $a_{32}$, and $a_{33}$ are the second matrix coefficients. The second multiplication operation is expressed shown below in Equation 12.

$$\begin{pmatrix} R'_{xy} \\ G'_{xy} \\ B'_{xy} \end{pmatrix} = \begin{pmatrix} a_{11} & a_{12} & a_{13} \\ a_{21} & a_{22} & a_{23} \\ a_{31} & a_{32} & a_{33} \end{pmatrix} \begin{pmatrix} R_{xy} \\ G_{xy} \\ B_{xy} \end{pmatrix} \quad [\text{Equation 12}]$$

In Equation 12, $R'_{xy}$, $G'_{xy}$, and $B'_{xy}$ are the color values after the second multiplication operation and $R_{xy}$, $G_{xy}$, and $B_{xy}$ are the color values before the second multiplication operation, xy is the pixel location.

For example, the color value $R'_{22}$ after the second multiplication operation is expressed in Equation 13.

$$R'_2 = a_{11}R_{22} + a_{12}\frac{(GB_{12}+GR_{21}+GR_{23}+GB_{32})}{4} + a_{13}\frac{(B_{11}+B_{13}+B_{31}+B_{33})}{4} \quad [\text{Equation 13}]$$

In some embodiments, the second matrix is expressed as follows:

$$\begin{pmatrix} a_{11} & a_{12} & a_{13} \\ 1-a_{11}-a_{31} & 1-a_{12}-a_{32} & 1-a_{13}-a_{33} \\ a_{31} & a_{32} & a_{33} \end{pmatrix}$$

where, $a_{11}$, $a_{12}$, $a_{13}$, $a_{21}$, $a_{22}$, $a_{23}$, $a_{31}$, $a_{32}$, and $a_{33}$ are the second matrix coefficients.

In some embodiments, the second multiplication operation is expressed shown below in Equation 14 by substituting the second matrix into Equation 12:

$$\begin{pmatrix} R'_{xy} \\ G'_{xy} \\ B'_{xy} \end{pmatrix} = \begin{pmatrix} a_{11} & a_{12} & a_{13} \\ 1-a_{11}-a_{31} & 1-a_{12}-a_{32} & 1-a_{13}-a_{33} \\ a_{31} & a_{32} & a_{33} \end{pmatrix} \begin{pmatrix} R_{xy} \\ G_{xy} \\ B_{xy} \end{pmatrix} \quad [\text{Equation 14}]$$

In Equation 14, $R'_{xy}$, $G'_{xy}$, and $B'_{xy}$ are the color values after the second multiplication operation and $R_{xy}$, $G_{xy}$, and $B_{xy}$ are the color values before the second multiplication operation, xy is the pixel location.

In some embodiments, the second matrix can be expressed as a 4×4 matrix as follows:

$$\begin{pmatrix} a_{11} & \frac{a_{12}}{2} & \frac{a_{12}}{2} & a_{13} \\ 1-a_{11}-a_{31} & 1-a_{12}-a_{32} & 0 & 1-a_{13}-a_{33} \\ 1-a_{11}-a_{31} & 0 & 1-a_{12}-a_{32} & 1-a_{13}-a_{33} \\ a_{31} & \frac{a_{32}}{2} & \frac{a_{32}}{2} & a_{33} \end{pmatrix}$$

where, $a_{11}$, $a_{12}$, $a_{13}$, $a_{21}$, $a_{22}$, $a_{23}$, $a_{31}$, $a_{32}$, and $a_{33}$ are the second matrix coefficients.

In some embodiments, the second multiplication operation is expressed shown below in Equation 15.

$$\begin{pmatrix} R'_{xy} \\ GR'_{xy} \\ GB'_{xy} \\ B'_{xy} \end{pmatrix} = \begin{pmatrix} a_{11} & \frac{a_{12}}{2} & \frac{a_{12}}{2} & a_{13} \\ 1-a_{11}-a_{31} & 1-a_{12}-a_{32} & 0 & 1-a_{13}-a_{33} \\ 1-a_{11}-a_{31} & 0 & 1-a_{12}-a_{32} & 1-a_{13}-a_{33} \\ a_{31} & \frac{a_{32}}{2} & \frac{a_{32}}{2} & a_{33} \end{pmatrix} \begin{pmatrix} R_{xy} \\ GR_{xy} \\ GB_{xy} \\ B_{xy} \end{pmatrix}$$

[Equation 15]

In Equation 15, $R'_{xy}$, $GR'_{xy}$, $GB'_{xy}$ and $B'_{xy}$ are the color values after the second multiplication operation and $R_{xy}$, $GR_{xy}$, $GB_{xy}$ and $B_{xy}$ are the color values before the second multiplication operation, and xy is the pixel location.

Figure 5B:
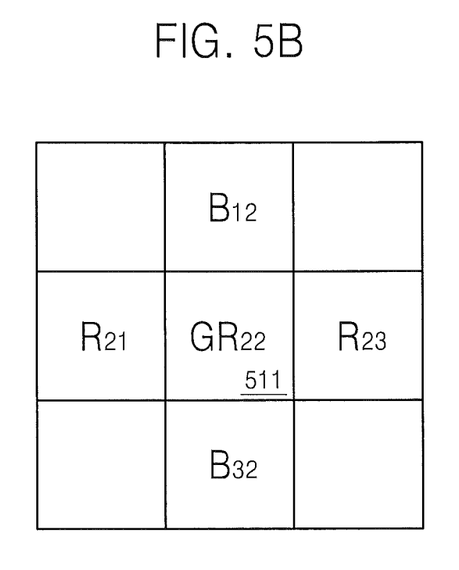
FIG. 5B is a diagram illustrating chromaticity correcting operations according to embodiments of the inventive concept.

FIG. 5B is a diagram illustrating chromaticity correcting operations in some embodiments of the inventive concept. Referring to FIGS. 1 to 3, 5A and 5B, the red value $R_{22}$ at the current pixel 511 can be interpolated as shown below in Equation 16.

$$R_{22}=(R_{21}+R_{23})/2 \quad \text{[Equation 16]}$$

The blue value $B_{22}$ at the current pixel 511 can be interpolated as shown below in Equation 17.

$$B_{22}=(B_{12}+B_{32})/2 \quad \text{[Equation 17]}$$

The color value $GR_{22}'$ at the current pixel 511 after the second multiplication operation is expressed shown below in Equation 18.

$$GR'_{22} = a_{21}\frac{(R_{21}+R_{23})}{2} + a_{22}GR_{22} + a_{32}\frac{(B_{12}+B_{32})}{2} \quad \text{[Equation 18]}$$

Figure 5C:
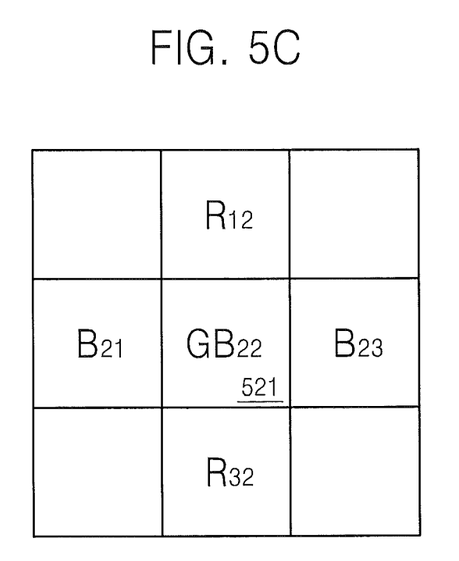
FIG. 5C is a diagram illustrating chromaticity correcting operations according to embodiments of the inventive concept.

FIG. 5C is a diagram for explaining chromaticity correcting operation according to still another example embodiment. Referring to FIGS. 1 to 3, 5A and 5C, the red value $R_{22}$ at the current pixel 521 can be interpolated as shown below in Equation 19.

$$R_{22}=(R_{12}+R_{32})/2 \quad \text{[Equation 19]}$$

The blue value $B_{22}$ at the current pixel 521 can be interpolated as shown below in Equation 20.

$$B_{22}=(B_{21}+B_{23})/2 \quad \text{[Equation 20]}$$

The color value $GB_{22}'$ at the current pixel 521 after the second multiplication operation is expressed shown below in Equation 21.

$$GB'_{22} = a_{21}\frac{(R_{12}+R_{32})}{2} + a_{22}GB_{22} + a_{32}\frac{(B_{21}+B_{23})}{2} \quad \text{[Equation 21]}$$

Figure 5D:
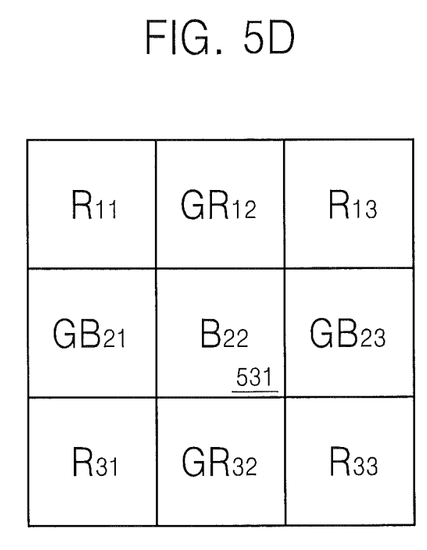
FIG. 5D is a diagram illustrating chromaticity correcting operations according to embodiments of the inventive concept.

FIG. 5D is a diagram for explaining chromaticity correcting operation according to still another example embodiment. Referring to FIGS. 1 to 3, 5A and 5D, the blue value $R_{22}$ at the current pixel 531 can be interpolated as shown below in Equation 22.

$$R_{22}=(R_{11}+R_{13}+R_{31}+R_{33})/4 \quad \text{[Equation 22]}$$

The green value $G_{22}$ at the current pixel 531 can be interpolated as shown below in Equation 23.

$$G_{22}=(GR_{12}+GB_{21}+GB_{23}+GR_{32})/4 \quad \text{[Equation 23]}$$

The color value B22' at the current pixel 531 after the second multiplication operation is expressed as shown below in Equation 24.

$$B'_{22} = a_{31}\frac{(R_{11}+R_{13}+R_{31}+R_{33})}{4} + a_{32}\frac{(GR_{12}+GB_{21}+GB_{23}+GR_{32})}{4} + a_{32}B_{22} \quad \text{[Equation 24]}$$

Figure 6:
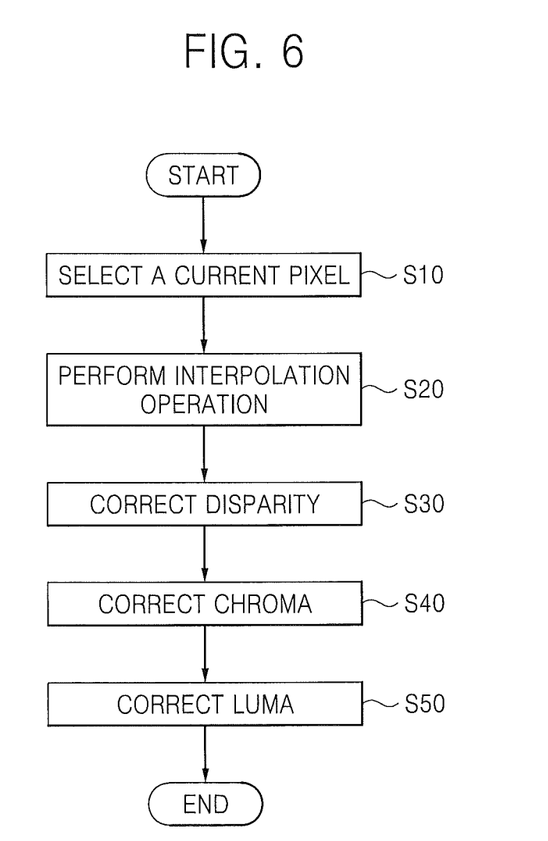
FIG. 6 is a flowchart illustrating methods of correcting crosstalk artifacts according to embodiments of the inventive concept.

FIG. 6 is a flowchart illustrating methods for correcting crosstalk artifacts in some embodiments of the inventive concept. Referring to FIGS. 1 to 6, the current pixel selector 221 selects the current pixel in the image data output from the image sensor 100 in operation S10.

The interpolator 223 performs an interpolation operation using color values of neighbor pixels to obtain interpolated color values at a current pixel selected by the current pixel selector 221 in operation S20.

The disparity filter 225 corrects color disparity between the current pixel and the neighboring pixels in operation S30. That is, the disparity filter 225 performs a multiplication operation between the interpolated color values and the first matrix.

The Chroma filter 227 corrects chromaticity in operation S40. That is, the Chroma filter 227 performs a multiplication operation between the interpolated color values and the second matrix.

The Luma filter 229 corrects Luma in operation S50. The Luma filter 229 performs a multiplication operation between the interpolated color values and a third matrix, The Luma filter 229 determines the matrix coefficient for Luma correction. The third matrix can be expressed as follows:

$$\begin{pmatrix} C & 0 & 0 & 0 \\ 0 & C & 0 & 0 \\ 0 & 0 & C & 0 \\ 0 & 0 & 0 & C \end{pmatrix}$$

where, C is the third matrix coefficient.

The multiplication operation for Luma correction can be expressed as shown below in Equation 25.

$$\begin{pmatrix} R'_{xy} \\ GR'_{xy} \\ GB'_{xy} \\ B'_{xy} \end{pmatrix} = \begin{pmatrix} C & 0 & 0 & 0 \\ 0 & C & 0 & 0 \\ 0 & 0 & C & 0 \\ 0 & 0 & 0 & C \end{pmatrix} \begin{pmatrix} R_{xy} \\ GR_{xy} \\ GB_{xy} \\ B_{xy} \end{pmatrix}$$ [Equation 25]

In Equation 25, $R'_{xy}$, $GR'_{xy}$, $GB'_{xy}$, and $B'_{xy}$ indicate the Luma corrected color values after the multiplication operation and $R_{xy}$, $GR_{xy}$, $GB_{xy}$, and $B_{xy}$ indicate the color values before the multiplication operation.

In some embodiments, the multiplication operations described above can be performed sequentially as shown. In some embodiments, the multiplication operations can be performed in any order without affecting the corrections provided by any of the multiplications. In some embodiments, the multiplication operations are performed simultaneously. Further, in some embodiments, the multiplication operations do not affect each other. In some embodiments, any of the multiplication operations can be eliminated.

The first, second and third matrix coefficients can be determined based on a calibration procedure that involves taking images in several illuminations and a color calibration target (e.g. Gretag-Macbeth Color Checker). The results provided by the calibration procedure can be used to interpolate the coefficients for each of the pixels on which correction to be performed.

Figure 7:
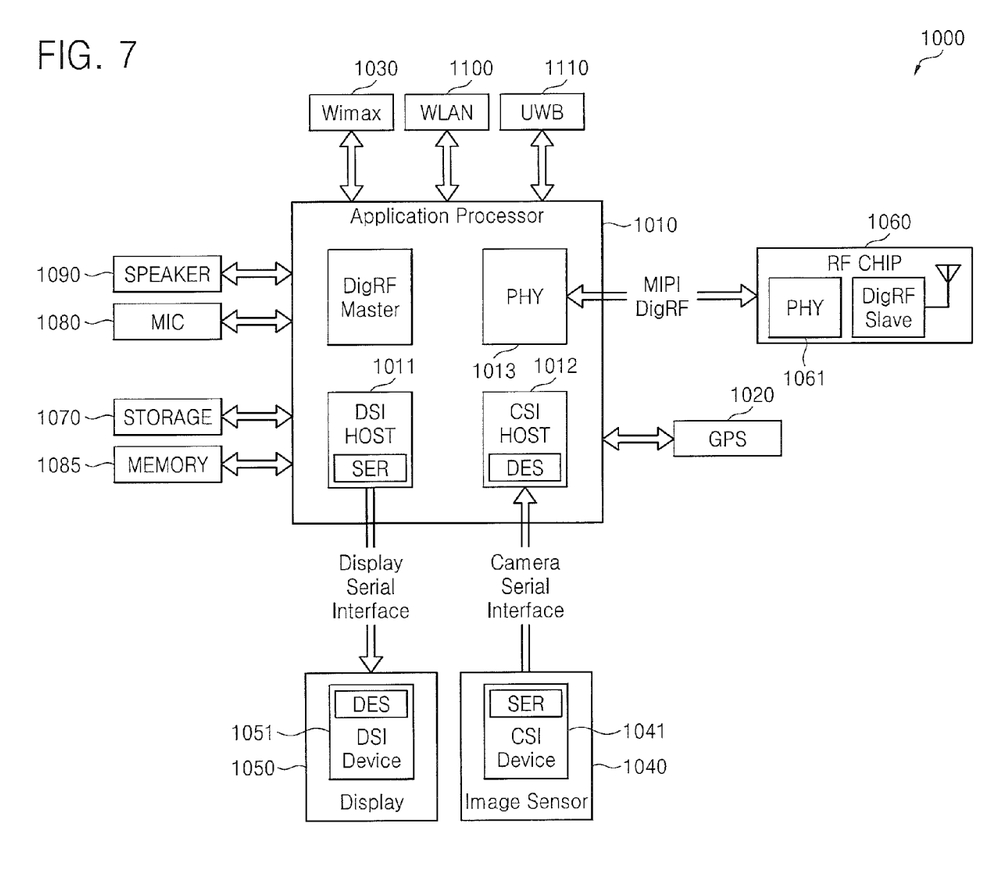
FIG. 7 is a schematic block diagram of an image processing system including an image sensor according to embodiments of the inventive concept.

FIG. 7 is a schematic block diagram of an image processing system 1000 including an image sensor 1040 in some embodiments of the inventive concept.

The image processing system 1000 may be implemented as a data processing device, such as a personal digital assistant (PDA), a portable media player (PMP), or a mobile communication device such as a mobile phone or a smart phone, which can use or support mobile industry processor interface (MIPI®). The image processing system 1000 may be also implemented as a portable device such as a tablet computer.

The image processing system 1000 includes an application processor 1010, the image sensor 1040, and a display 1050.

A camera serial interface (CSI) host 1012 implemented in the application processor 1010 may perform serial communications with a CSI device 1041 included in the image sensor 1040 through CSI. A display serial interface (DSI) host 1011 implemented in the application processor 1010 may perform serial communication with a DSI device 1051 included in the display 1050 through DSI.

The image processing system 1000 may also include a radio frequency (RF) chip 1060 communicating with the application processor 1010. A physical layer (PHY) 1013 of the application processor 1010 and a PHY 1061 of the RF chip 1060 may communicate data with each other according to Mobile Industry Processor Interface (MIPI) DigRF.

The image processing system 1000 may further include a global positioning system (GPS) 1020, a data storage device 1070, a microphone (MIC) 1080, a memory 1085 (such as a dynamic random access memory (DRAM)), and a speaker 1090. The image processing system 1000 may communicate using a worldwide interoperability for microwave access (Wimax) 1030, a wireless local area network (WLAN) 1100, and ultra-wideband (UWB) 1160.

While some example embodiments of the inventive concept have been particularly shown and described, it will be understood by those of ordinary skill in the art that various changes in form and details may be made therein without departing from the spirit and scope of the present invention as defined by the following claims.

What is claimed:

1. A method for correcting crosstalk artifacts in an image signal processor circuit, the method comprising:
performing an interpolation operation using color values of neighbor pixels to obtain interpolated color values at a current pixel in an image sensor;
determining first matrix coefficients of a first matrix; and
performing a first multiplication operation, using the image signal processor circuit, between the interpolated color values and the first matrix to correct disparity between the current pixel and the neighbor pixels in an image sensor independent of correcting chromaticity between the current pixel and the neighbor pixels and Luma between the current pixel and the neighbor pixels.

2. The method of claim 1, the first matrix is expressed as follows:

$$\begin{pmatrix} 1 & 0 & 0 & 0 \\ \frac{d_1}{2} & 1+\frac{d_2}{2} & \frac{d_2}{2} & \frac{d_3}{2} \\ -\frac{d_1}{2} & -\frac{d_2}{2} & 1-\frac{d_2}{2} & -\frac{d_3}{2} \\ 0 & 0 & 0 & 1 \end{pmatrix}$$

wherein d1, d2, and d3 are the first matrix coefficients.

3. The method of claim 1, further comprising:
determining second matrix coefficients of second matrix; and
performing a second multiplication operation between the interpolated color values and the second matrix to correct the chromaticity.

4. The method of claim 3, the second matrix is expressed as follows:

$$\begin{pmatrix} a_{11} & a_{12} & a_{13} \\ a_{21} & a_{22} & a_{23} \\ a_{31} & a_{32} & a_{33} \end{pmatrix}$$

wherein $a_{11}$, $a_{12}$, $a_{13}$, $a_{31}$, $a_{32}$, and $a_{33}$ are coefficients.

5. The method of claim 1, further comprising:
determining a third matrix coefficient of a third matrix; and
performing a third multiplication operation between the interpolated color values and the third matrix to correct the Luma.

6. The method of claim 5, the third matrix is expressed as follows:

$$\begin{pmatrix} C & 0 & 0 & 0 \\ 0 & C & 0 & 0 \\ 0 & 0 & C & 0 \\ 0 & 0 & 0 & C \end{pmatrix}$$

wherein C is a coefficient.

7. The method of claim 5, wherein the first, second and third multiplication operations are performed sequentially.

8. The method of claim 5, wherein the first, second, and third multiplication operations are performed simultaneously.

9. The method of claim 5, wherein the first, second, and third multiplication operations do not affect each other.

10. An image signal processor, comprising:
    a current pixel selector configured to select a current pixel in an image data output from an image sensor;
    an interpolator configured to obtain interpolated color values at the current pixel; and
    a disparity filter configured to perform a first multiplication operation between the interpolated color values and a first matrix for correcting disparity between the current pixel and neighbor pixels independent of correcting chromaticity between the current pixel and the neighbor pixels and Luma between the current pixel and the neighbor pixels.

11. The image signal processor of claim 10, further comprising:
    a Chroma filter configured to perform a second multiplication operation between the interpolated color values and a second matrix for correcting the chromaticity.

12. The image signal processor of claim 11, further comprising:
    a Luma filter configured to perform a third multiplication operation between the interpolated color values and a third matrix for correcting the Luma.

13. The image signal processor of claim 12, wherein the first, second, and third multiplication operations are performed sequentially.

14. The image signal processor of claim 12, wherein the first, second, and third multiplication operations are performed simultaneously.

15. The image signal processor of claim 12, wherein the first, second, and third multiplication operations do not affect each other.

16. The image signal processor of claim 10, the first matrix is expressed as follows:

$$\begin{pmatrix} 1 & 0 & 0 & 0 \\ \frac{d_1}{2} & 1+\frac{d_2}{2} & \frac{d_2}{2} & \frac{d_3}{2} \\ -\frac{d_1}{2} & -\frac{d_2}{2} & 1-\frac{d_2}{2} & -\frac{d_3}{2} \\ 0 & 0 & 0 & 1 \end{pmatrix}$$

wherein d1, d2, and d3 are the first matrix coefficients.

* * * * *